United States Patent
Kikuchi et al.

(10) Patent No.: US 9,130,539 B2
(45) Date of Patent: Sep. 8, 2015

(54) ELASTIC WAVE DEVICE WITH STACKED PIEZOELECTRIC SUBSTRATES

(71) Applicant: Murata Manufacturing Co., Ltd., Nagaokakyo-shi, Kyoto-fu (JP)

(72) Inventors: Taku Kikuchi, Nagaokakyo (JP); Hisashi Yamazaki, Nagaokakyo (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 14/589,043

(22) Filed: Jan. 5, 2015

(65) Prior Publication Data
US 2015/0109071 A1 Apr. 23, 2015

(30) Foreign Application Priority Data
Aug. 29, 2012 (JP) ................ 2012-188535

(51) Int. Cl.
| | |
|---|---|
| *H03H 9/70* | (2006.01) |
| *H03H 9/72* | (2006.01) |
| *H03H 9/64* | (2006.01) |
| *H03H 9/05* | (2006.01) |
| *H03H 9/02* | (2006.01) |
| *H03H 9/54* | (2006.01) |

(52) U.S. Cl.
CPC ............ *H03H 9/64* (2013.01); *H03H 9/02834* (2013.01); *H03H 9/0576* (2013.01); *H03H 9/0585* (2013.01); *H03H 9/70* (2013.01); *H03H 9/725* (2013.01); *H03H 9/54* (2013.01)

(58) Field of Classification Search
CPC ............ H03H 9/02834; H03H 9/0547; H03H 9/0566; H03H 9/0576; H03H 9/058; H03H 9/0585; H03H 9/059; H03H 9/08; H03H 9/64; H03H 9/70; H03H 9/725; H03H 9/54
USPC ............ 333/133, 193, 195; 310/313 R, 313 B
See application file for complete search history.

(56) References Cited

U.S. PATENT DOCUMENTS

| | | | | |
|---|---|---|---|---|
| 7,213,314 | B2 * | 5/2007 | Abbott et al. ................ | 29/25.35 |
| 7,331,092 | B2 * | 2/2008 | Miura et al. ................ | 29/25.35 |

(Continued)

FOREIGN PATENT DOCUMENTS

| | | |
|---|---|---|
| JP | 11-340769 A | 12/1999 |
| JP | 2002-009584 A | 1/2002 |

(Continued)

OTHER PUBLICATIONS

Official Communication issued in International Patent Application No. PCT/JP2013/069871, mailed on Oct. 1, 2013.

*Primary Examiner* — Barbara Summons
(74) *Attorney, Agent, or Firm* — Keating & Bennett, LLP

(57) ABSTRACT

An elastic wave device includes a first elastic wave element, a second elastic wave element, and a first substrate. The first elastic wave element includes a first piezoelectric substrate. The second elastic wave element includes a second piezoelectric substrate. The second piezoelectric substrate is stacked on the first piezoelectric substrate. A coefficient of linear expansion of the second piezoelectric substrate is greater than a coefficient of linear expansion of the first piezoelectric substrate. The first substrate is bonded to the second piezoelectric substrate. A coefficient of linear expansion of the first substrate is lower than the coefficient of linear expansion of the second piezoelectric substrate.

18 Claims, 1 Drawing Sheet

(56) References Cited

U.S. PATENT DOCUMENTS

| | | |
|---|---|---|
| 2005/0057323 A1* | 3/2005 | Kando .......................... 333/141 |
| 2007/0290374 A1 | 12/2007 | Wolfgang |
| 2009/0224851 A1 | 9/2009 | Feiertag et al. |
| 2009/0236935 A1* | 9/2009 | Kando .................... 310/313 R |
| 2010/0167215 A1 | 7/2010 | Suzuki et al. |
| 2011/0006381 A1 | 1/2011 | Feiertag et al. |
| 2011/0146041 A1 | 6/2011 | Miyake et al. |
| 2012/0306593 A1 | 12/2012 | Kidoh |

FOREIGN PATENT DOCUMENTS

| | | |
|---|---|---|
| JP | 2005-033689 A | 2/2005 |
| JP | 2005-191716 A | 7/2005 |
| JP | 2006-298694 A | 11/2006 |
| JP | 2007-060465 A | 3/2007 |
| JP | 2007-235304 A | 9/2007 |
| JP | 2007-526641 A | 9/2007 |
| JP | 2008-270901 A | 11/2008 |
| JP | 2008-546207 A | 12/2008 |
| JP | 2009-094661 A | 4/2009 |
| JP | 2010-171392 A | 8/2010 |
| JP | 2011-506106 A | 3/2011 |
| JP | 2011-130385 A | 6/2011 |
| JP | 2011-211331 A | 10/2011 |
| WO | 2011/102049 A1 | 8/2011 |

* cited by examiner

ELASTIC WAVE DEVICE WITH STACKED PIEZOELECTRIC SUBSTRATES

BACKGROUND OF THE INVENTION

1. Field of the Invention

The present invention relates to elastic wave devices.

2. Description of the Related Art

Elastic wave devices that use surface acoustic waves, for example, have thus far been widely used in filter devices and the like. Japanese Unexamined Patent Application Publication No. 2011-506106 discloses an elastic wave device in which a plurality of elastic wave elements are bonded together in an integrated manner, for example.

However, there is a problem with such an elastic wave device in which a plurality of elastic wave elements are bonded together in an integrated manner having a low temperature cycle resistivity.

SUMMARY OF THE INVENTION

Preferred embodiments of the present invention provide an elastic wave device having superior temperature cycle resistivity.

An elastic wave device according to a preferred embodiment of the present invention includes a first elastic wave element, a second elastic wave element, and a first substrate. The first elastic wave element includes a first piezoelectric substrate. The second elastic wave element includes a second piezoelectric substrate. The second piezoelectric substrate is stacked on the first piezoelectric substrate. A coefficient of linear expansion of the second piezoelectric substrate is greater than a coefficient of linear expansion of the first piezoelectric substrate. The first substrate is bonded to the second piezoelectric substrate. A coefficient of linear expansion of the first substrate is lower than the coefficient of linear expansion of the second piezoelectric substrate.

In an elastic wave device according to a specific aspect of various preferred embodiments of the present invention, the first substrate preferably has the same composition as the first piezoelectric substrate.

In an elastic wave device according to another specific aspect of various preferred embodiments of the present invention, the elastic wave device further includes a second substrate. The second substrate is bonded to the second piezoelectric substrate. The first and second substrates both preferably have lower coefficients of linear expansion than the first piezoelectric substrate.

In an elastic wave device according to another specific aspect of various preferred embodiments of the present invention, the first substrate and the second substrate preferably have the same composition.

In an elastic wave device according to yet another specific aspect of various preferred embodiments of the present invention, the first and second substrates preferably are configured of sapphire, silicon, or glass.

In an elastic wave device according to yet another specific aspect of various preferred embodiments of the present invention, at least one of a composition and a cut-angle preferably differs between the first piezoelectric substrate and the second piezoelectric substrate.

In an elastic wave device according to still another specific aspect of various preferred embodiments of the present invention, the first elastic wave element further includes a first interdigital transducer electrode. The first interdigital transducer electrode is provided on the first piezoelectric substrate. The second elastic wave element further includes a second interdigital transducer electrode. The second interdigital transducer electrode is provided on the second piezoelectric substrate.

According to various preferred embodiments of the present invention, an elastic wave device having superior temperature cycle resistivity is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
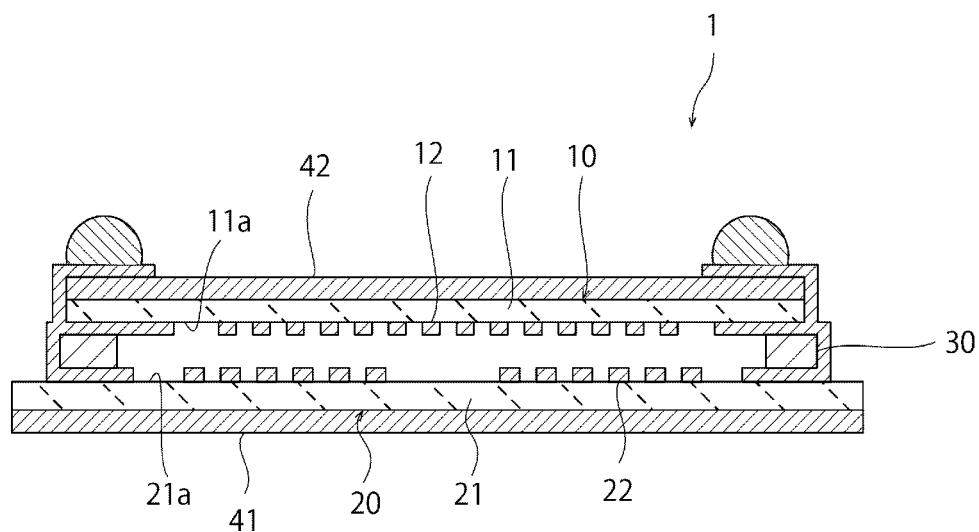
FIG. 1 is an overall cross-sectional view illustrating an elastic wave device according to a first preferred embodiment of the present invention.

Examples of preferred embodiments for carrying out the present invention will be described hereinafter. Note, however, that the following preferred embodiments are merely examples. The present invention is not intended to be limited to the following preferred embodiments in any way.

Furthermore, in the drawings referred to in the preferred embodiments and the like, members having functions that are identical or substantially identical are given identical reference numerals. Moreover, the drawings referred to in the preferred embodiments and the like are schematic depictions. As such, the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be determined from the following descriptions.

First Preferred Embodiment

FIG. 1 is an overall cross-sectional view illustrating an elastic wave device according to a first preferred embodiment of the present invention. As shown in FIG. 1, an elastic wave device 1 includes a first elastic wave element 10 and a second elastic wave element 20. The first elastic wave element 10 includes a first piezoelectric substrate 11 and a first interdigital transducer electrode 12 disposed on one main surface 11a of the first piezoelectric substrate 11. Likewise, the second elastic wave element 20 includes a second piezoelectric substrate 21 and a second interdigital transducer electrode 22 disposed on one main surface 21a of the second piezoelectric substrate 21. The main surface 21a of the second piezoelectric substrate 21 faces the main surface 11a of the first piezoelectric substrate 11. The first and second piezoelectric substrates 11 and 21 are bonded to each other so that the main surfaces 11a and 21a of the first and second piezoelectric substrates 11 and 21 overlap when viewed from above. A convex portion or a groove may be provided on the main surfaces 11a and 21a of the first and second piezoelectric substrates 11 and 21 in order to provide a space in which vibration is possible. The first and second interdigital transducer electrodes 12 and 22 preferably are configured through a known construction technique such as sputtering, using, for example, Al, Pt, Au, Ag, Cu, Ni, Ti, Cr, or Pd, an alloy containing at least one of those metals, or the like. The first and second piezoelectric substrates 11 and 21 preferably are configured of a material such as $LiNbO_3$, $LiTaO_3$, or the like, for example. In the present preferred embodiment, at least one of the composition and the cut-angle preferably differs between the first piezoelectric substrate 11 and the second piezoelectric substrate 21. The coefficient of linear expansion of the second piezoelectric substrate 21 is greater than the coefficient of linear expansion of the first piezoelectric substrate 11.

The elastic wave device 1 preferably is a duplexer in which one of the first and second elastic wave elements 10 and 20 configures a transmission filter and the other configures a reception filter.

Note, however, that in other preferred embodiments of the present invention, both of the first and second elastic wave elements 10 and 20 may be transmission filters, and both may be reception filters, for example.

The first elastic wave element 10 is stacked upon a main surface of the second elastic wave element 20. The second piezoelectric substrate 21 is disposed upon the main surface of the first piezoelectric substrate 11 so as to face the first piezoelectric substrate 11. The first piezoelectric substrate 11 and the second piezoelectric substrate 21 are bonded together by a bonding layer 30 so that a gap is present between the first piezoelectric substrate 11 and the second piezoelectric substrate 21. A space in which the first and second interdigital transducer electrodes 12 and 22 can vibrate is provided as a result. The bonding layer 30 preferably is configured of a resin such as an acrylic resin, a urethane resin, an epoxy resin, a silicone resin, a vinyl acetate resin, a polyimide resin, or the like.

As described above, the coefficient of linear expansion of the second piezoelectric substrate 21 preferably is greater than the coefficient of linear expansion of the first piezoelectric substrate 11. Accordingly, there is a risk that a temperature cycle resistivity will drop due to stress produced by the difference between the respective coefficients of linear expansion of the first piezoelectric substrate 11 and the second piezoelectric substrate 21. Here, in the elastic wave device 1, a first substrate 41 having a lower coefficient of linear expansion than the second piezoelectric substrate 21 is bonded to the second piezoelectric substrate 21. Si, $SiO_2$ (fused silica), $Al_2O_3$, $Si_3N_4$, AlN, or the like preferably is used as the material having a lower coefficient of linear expansion. Accordingly, the difference between the coefficients of linear expansion of the first elastic wave element 10 and the second elastic wave element 20 is significantly reduced. A superior temperature cycle resistivity is realized as a result.

Furthermore, the elastic wave device 1 is provided with a second substrate 42 in addition to the first substrate 41. The second substrate 42 is bonded to the first piezoelectric substrate 11. The first and second substrates 41 and 42 both preferably have lower coefficients of linear expansion than the first piezoelectric substrate 11. Accordingly, the difference between the coefficients of linear expansion of the first elastic wave element 10 and the second elastic wave element 20 are further reduced, and the coefficient of linear expansion of the first elastic wave element 10 and the coefficient of linear expansion of the second elastic wave element 20 are reduced as well. A more superior temperature cycle resistivity is realized as a result. Meanwhile, it is preferable for the difference between the coefficients of linear expansion of the second piezoelectric substrate and the first substrate to be the same as the difference between the coefficients of linear expansion of the first piezoelectric substrate and the second substrate, in order to increase the temperature cycle resistivity. Accordingly, a difference in changes in thermal expansion due to temperature cycles is significantly reduced.

From the standpoint of realizing more superior temperature cycle resistivity, it is preferable for the first and second substrates 41 and 42 to have the same compositions.

It is furthermore preferable for the first and second substrates 41 and 42 to be configured of materials having low coefficients of linear expansion and superior heat dissipation. The first and second substrates 41 and 42 preferably are configured of sapphire, silicon, glass, or the like, for example.

Note that the bond between the first substrate 41 and the second piezoelectric substrate 21 and the bond between the second substrate 42 and the first piezoelectric substrate 11 is preferably provided by anodic bonding, eutectic bonding, adhesive bonding, fusion bonding, thermocompression bonding, or the like, for example.

Another example of a preferred embodiment of the present invention will be described hereinafter. In the following descriptions, members having identical or substantially identical functions as those in the first preferred embodiment will be referred to using the same reference numerals, and descriptions thereof will be omitted.

Second Preferred Embodiment

Figure 2:
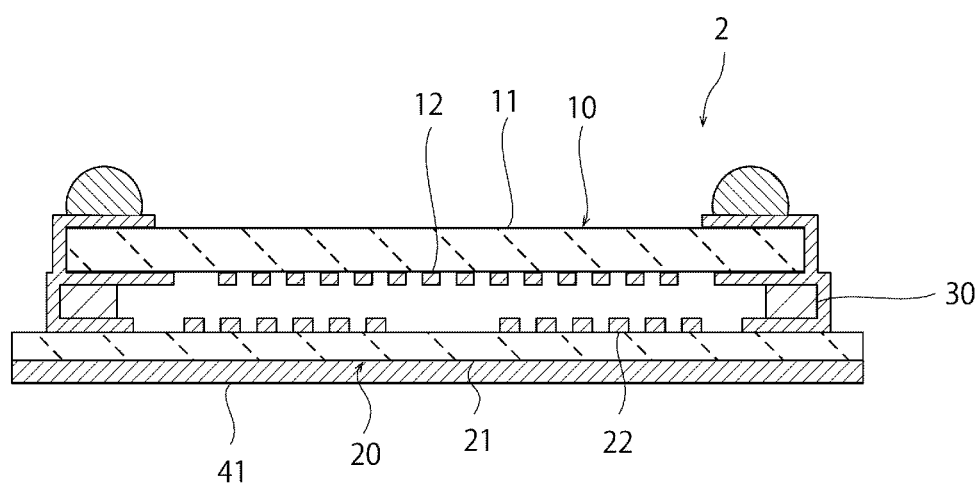
FIG. 2 is an overall cross-sectional view illustrating an elastic wave device according to a second preferred embodiment of the present invention.

FIG. 2 is an overall cross-sectional view illustrating an elastic wave device according to a second preferred embodiment of the present invention.

The first preferred embodiment describes an example of the elastic wave device 1 in which the first substrate 41 is bonded to the second piezoelectric substrate 21 and the second substrate 42 is bonded to the first piezoelectric substrate 11. However, the present invention is not limited to such a configuration.

For example, the first substrate 41 may be provided and the second substrate 42 may be omitted, as with an elastic wave device 2 shown in FIG. 2. The difference between coefficients of thermal expansion is significantly reduced in this case as well, which makes it possible to realize a superior temperature cycle resistivity.

Note that in this case, the first substrate 41 preferably is configured of sapphire, silicon, or glass, and/or may have the same composition as the first piezoelectric substrate 11.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a first elastic wave element including a first piezoelectric substrate;
a second elastic wave element including a second piezoelectric substrate that is stacked on the first piezoelectric substrate and has a greater coefficient of linear expansion than the first piezoelectric substrate; and
a first substrate that is bonded to the second piezoelectric substrate and has a lower coefficient of linear expansion than the second piezoelectric substrate.

2. The elastic wave device according to claim 1, wherein the first substrate has a same composition as the first piezoelectric substrate.

3. The elastic wave device according to claim 1, further comprising:

a second substrate that is bonded to the first piezoelectric substrate; wherein
the first and second substrates both have lower coefficients of linear expansion than the first piezoelectric substrate.

4. The elastic wave device according to claim 3, wherein the first substrate has a same composition as the second substrate.

5. The elastic wave device according to claim 3, wherein the first and second substrates are configured of sapphire, silicon, or glass.

6. The elastic wave device according to claim 3, wherein the first and second substrates are configured of one of sapphire, silicon, and glass.

7. The elastic wave device according to claim 3, wherein a difference between coefficients of linear expansion of the second piezoelectric substrate and the first substrate is equal to a difference between coefficients of linear expansion of the first piezoelectric substrate and the second substrate.

8. The elastic wave device according to claim 3, wherein the second substrate and the first piezoelectric substrate are bonded to each other via one of anodic bonding, eutectic bonding, adhesive bonding, fusion bonding, and thermocompression bonding.

9. The elastic wave device according to claim 1, wherein at least one of a composition and a cut-angle differs between the first piezoelectric substrate and the second piezoelectric substrate.

10. The elastic wave device according to claim 1, wherein the first elastic wave element further includes a first interdigital transducer electrode provided on the first piezoelectric substrate; and
the second elastic wave element further includes a second interdigital transducer electrode provided on the second piezoelectric substrate.

11. The elastic wave device according to claim 1, wherein both of the first and second elastic wave elements define transmission filters.

12. The elastic wave device according to claim 1, wherein both of the first and second elastic wave elements define reception filters.

13. The elastic wave device according to claim 1, further comprising a bonding layer configured to bond the first piezoelectric substrate and the second piezoelectric substrate together so that a gap is present between the first piezoelectric substrate and the second piezoelectric substrate.

14. The elastic wave device according to claim 13, wherein the bonding layer is configured of one of an acrylic resin, a urethane resin, an epoxy resin, a silicone resin, a vinyl acetate resin, and a polyimide resin.

15. The elastic wave device according to claim 1, wherein the first and second piezoelectric substrates are configured of one of $LiNbO_3$ and $LiTaO_3$.

16. The elastic wave device according to claim 1, wherein the elastic wave device is a duplexer.

17. The elastic wave device according to claim 16, wherein one of the first and second elastic wave elements defines a transmission filter and the other of the first and second elastic wave elements defines a reception filter.

18. The elastic wave device according to claim 1, wherein the first substrate and the second piezoelectric substrate are bonded to each other via one of anodic bonding, eutectic bonding, adhesive bonding, fusion bonding, and thermocompression bonding.

* * * * *

UNITED STATES PATENT AND TRADEMARK OFFICE
CERTIFICATE OF CORRECTION

| | | |
|---|---|---|
| PATENT NO. | : 9,130,539 B2 | Page 1 of 1 |
| APPLICATION NO. | : 14/589043 | |
| DATED | : September 8, 2015 | |
| INVENTOR(S) | : Taku Kikuchi et al. | |

It is certified that error appears in the above-identified patent and that said Letters Patent is hereby corrected as shown below:

Title Page

The following should be corrected for the Related U.S. Application Data in item (63) on the front page of the Patent:

Related U.S. Application Data
(63) Continuation of application No. PCT/JP2013/069871, filed July 23, 2013

Signed and Sealed this
Ninth Day of February, 2016

Michelle K. Lee
*Director of the United States Patent and Trademark Office*